United States Patent
Hung

(10) Patent No.: US 11,630,786 B2
(45) Date of Patent: Apr. 18, 2023

(54) NON-SEQUENTIAL PAGE CONTINUOUS READ

(71) Applicant: MACRONIX INTERNATIONAL CO., LTD., Hsinchu (TW)

(72) Inventor: Shuo-Nan Hung, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/321,193

(22) Filed: May 14, 2021

(65) Prior Publication Data
US 2021/0271612 A1    Sep. 2, 2021

Related U.S. Application Data

(63) Continuation of application No. 16/544,055, filed on Aug. 19, 2019, now Pat. No. 11,048,649, which is a
(Continued)

(51) Int. Cl.
*G06F 13/16*    (2006.01)
*G06F 3/06*     (2006.01)
(Continued)

(52) U.S. Cl.
CPC ........ *G06F 13/1668* (2013.01); *G06F 3/0611* (2013.01); *G06F 3/0659* (2013.01);
(Continued)

(58) Field of Classification Search
CPC ........... G06F 11/1068; H03M 13/1545; H03M 13/152; G11C 11/4093; G11C 11/4094;
(Continued)

(56) References Cited

U.S. PATENT DOCUMENTS

| | | |
|---|---|---|
| 5,768,215 A | 6/1998 | Kwon et al. |
| 6,615,307 B1 | 9/2003 | Roohparvar |

(Continued)

FOREIGN PATENT DOCUMENTS

| | | |
|---|---|---|
| CN | 104425014 A | 3/2015 |
| CN | 103871447 B | 3/2017 |

(Continued)

OTHER PUBLICATIONS

"W25Q128FV Data Sheet"—(Winbond)—(May 13, 2016) (Year: 2016).*

(Continued)

*Primary Examiner* — Cynthia Britt
*Assistant Examiner* — Matthew W Wahlin
(74) *Attorney, Agent, or Firm* — Andrew L. Dunlap; Haynes Beffel & Wolfeld LLP

(57) ABSTRACT

A memory device such as a page mode NAND flash including a page buffer, and an input/output interface for I/O data units having an I/O width less than the page width supports continuous page read with non-sequential addresses. A controller controls a continuous page read operation to output a stream of pages at the I/O interface. The continuous read operation includes responding to a series of commands to output a continuous stream of pages. The series of commands including a first command and a plurality of intra-stream commands received before completing output of a preceding page in the stream. The first command includes an address to initiate the continuous page read operation, and at least one intra-stream command in the plurality of intra-stream commands includes a non-sequential address to provide the non-sequential page in the stream of pages.

18 Claims, 10 Drawing Sheets

Related U.S. Application Data continuation-in-part of application No. 16/533,463, filed on Aug. 6, 2019, now Pat. No. 10,977,121.

(60) Provisional application No. 62/746,911, filed on Oct. 17, 2018, provisional application No. 62/746,770, filed on Oct. 17, 2018.

(51) Int. Cl.
 *G06F 11/10* (2006.01)
 *G11C 29/52* (2006.01)

(52) U.S. Cl.
 CPC ........ *G06F 3/0679* (2013.01); *G06F 11/1068* (2013.01); *G11C 29/52* (2013.01)

(58) Field of Classification Search
 CPC ..... G11C 7/1057; G11C 7/1084; G11C 29/42; G11C 16/26; G11C 16/0483
 See application file for complete search history.

(56) References Cited

U.S. PATENT DOCUMENTS

| | | | |
|---|---|---|---|
| 7,423,915 | B2 | 9/2008 | Leong et al. |
| 7,644,224 | B2 | 1/2010 | Murin et al. |
| 8,261,008 | B2 | 9/2012 | Que |
| 8,358,558 | B2 | 1/2013 | Lee et al. |
| 8,375,273 | B2 | 2/2013 | Hara |
| 8,705,293 | B2 | 4/2014 | She et al. |
| 8,902,668 | B1 | 12/2014 | Dutta et al. |
| 9,009,566 | B2 | 4/2015 | Hung et al. |
| 9,053,762 | B2 | 6/2015 | Hirobe |
| 9,136,006 | B2 | 9/2015 | Hung et al. |
| 9,349,469 | B2 | 5/2016 | Chen et al. |
| 9,411,521 | B2 | 8/2016 | Lu et al. |
| 9,483,348 | B2 | 11/2016 | Yun |
| 9,536,601 | B2 | 1/2017 | Chen et al. |
| 9,552,882 | B2 | 1/2017 | Tseng et al. |
| 9,690,650 | B2 | 6/2017 | Liu et al. |
| 9,971,647 | B2 | 5/2018 | Michael |
| 10,957,384 | B1 | 3/2021 | Hung et al. |
| 11,048,649 | B2 | 6/2021 | Hung |
| 2003/0093744 | A1 | 5/2003 | Leung et al. |
| 2004/0109358 | A1* | 6/2004 | Roohparvar ........... G11C 16/26 365/185.33 |
| 2006/0146607 | A1 | 7/2006 | Hosono et al. |
| 2009/0168530 | A1 | 7/2009 | Yamamura et al. |
| 2011/0063748 | A1 | 3/2011 | Song et al. |
| 2013/0145093 | A1 | 6/2013 | Kaminaga et al. |
| 2013/0286752 | A1 | 10/2013 | Michioka et al. |
| 2013/0346671 | A1 | 12/2013 | Michael et al. |
| 2014/0258811 | A1 | 9/2014 | Liu et al. |
| 2015/0255167 | A1 | 9/2015 | Gillingham et al. |
| 2016/0034346 | A1* | 2/2016 | Michael ............... H03M 13/13 714/755 |
| 2016/0372184 | A1 | 12/2016 | Shalvi et al. |
| 2017/0185353 | A1 | 6/2017 | Intrater et al. |
| 2018/0088867 | A1 | 3/2018 | Kaminaga et al. |
| 2018/0090202 | A1 | 3/2018 | Kaminaga et al. |
| 2018/0143908 | A1 | 5/2018 | Zhang et al. |
| 2019/0196972 | A1 | 6/2019 | Benisty et al. |
| 2020/0125443 | A1 | 4/2020 | Hung et al. |
| 2020/0142843 | A1 | 5/2020 | Hung |

FOREIGN PATENT DOCUMENTS

| | | |
|---|---|---|
| JP | 2003529883 A | 10/2003 |
| JP | 2009158015 A | 7/2009 |
| JP | 2013118031 A | 6/2013 |
| TW | 201324516 A | 6/2013 |
| TW | 201421238 A | 6/2014 |
| TW | 201830404 A | 8/2018 |
| WO | 0175896 A2 | 10/2001 |

OTHER PUBLICATIONS

"3V, 2G/4G-bit NAND Flash Memory, MX30LFx4G18AC", Macronix International Co., Ltd., http://www.macronix.com, Revision 1.4, Jan. 20, 2017, 80 pages.

EP Extended EP Search Report from Application No. 19200579.1 dated Mar. 10, 2020, 8 pages.

JP Office Action in 2019-185125 dated Oct. 19, 2020, 6 pages.

Macronix International Co., Ltd. Technical Note, "Improving NAND Throughput with Two-Plane and Cache Operations," Rev. 1, Nov. 15, 2013, 13 pages.

Micron Technology, Inc. Technical Note "NAND Flash 101: An Introduction to NAND Flash and How to Design it in to Your Next Product," TN-29-19, Rev. B, at least as early as Dec. 2006, 27 pages.

Micron Technology, Inc. Technical Note "NAND Flash Performance Increase Using the Micron Page Read Cache Mode Command," TN-29-01, at least as early as Dec. 2004, 10 pages.

TW Office Action in 10920963630 dated Oct. 7, 2020, 4 pages.

U.S. Office Action in U.S. Appl. No. 16/533,463 dated Jul. 23, 2020, 8 pages.

U.S. Office Action in U.S. Appl. No. 16/581,562 dated Aug. 10, 2020, 8 pages.

* cited by examiner

NON-SEQUENTIAL PAGE CONTINUOUS READ

PRIORITY APPLICATION

This application is a continuation of U.S. patent application Ser. No. 16/544,055 filed on 19 Aug. 2019 (now U.S. Pat. No. 11,048,649), which application is a continuation-in-part of U.S. patent application Ser. No. 16/533,463 filed on 6 Aug. 2019 (now U.S. Pat. No. 10,977,121), which application claims benefit of U.S. Provisional Patent Application Nos. 62/746,911 filed 17 Oct. 2018 and 62/746,770 filed 17 Oct. 2018, which applications are incorporated herein by reference.

BACKGROUND

Field

The present invention relates to integrated circuit memory devices, such as NAND flash devices, that support continuous read operations, and particularly continuous page read operations.

Description of Related Art

Read latency, sometimes specified as tR, is the time between receiving a read command and the time at which data requested by the read command is available at the output.

This type of latency can be relatively long in NAND flash devices. As a result, NAND flash can be considerably slower than other types of memory, such as NOR flash, for some operations.

Command sequences known as cache read and as continuous read have been developed to address this latency for NAND flash devices.

In the cache read command sequence, the latency tR can be reduced by overlapping some of the procedures, such as error checking and correcting using a cache or other buffer memory structure on the device. The latency that is encountered in a cache read command sequence is sometimes specified as tRCBSY. This can improve the throughput of the system using NAND flash. In a continuous command sequence, NAND flash devices have been configured to output sequential pages after the initial latency (tR), so that the sequential pages are available without delay between the pages. Continuous read operations for NAND flash can include three basic steps, as follows:

(Step 1) Start phase: the host needs to issue page read (C1) command to read out the data of the new page address to the cache. It takes a read latency tR to read out the page data.

(Step 2) Sequential Continuous read phase: the host reads out the data from the interface on the memory device continuously in this phase.

(Step 3) End phase: Depending on the read protocol, the host either needs to issue "end" (C3) command (some common NAND Flash devices) or raise the chip select control signal CS from 0 to 1 (SPI NAND Flash devices) to terminate the sequential continuous read operation. It takes a reset latency tRST to terminate the sequential continuous read operation.

However, if a non-sequential page is required, then a new command sequence must be instituted with the attendant latency involved in the initiation of the new sequence.

It is desirable to provide a technology which can overcome the long latency between non-sequential pages for NAND flash and other types of memory devices.

SUMMARY

A memory device, such as a page mode NAND flash including a page buffer, and an input/output interface for I/O data units having an I/O width less than the page width supports continuous page read with non-sequential addresses. The input/output interface can comprise a serial interface (e.g. SPI), or a parallel interface.

A command protocol is provided to support continuous reads with non-sequential addresses. The command protocol can include a first command to initiate a continuous read of a stream of pages with a starting address and sequential addresses thereafter, a second command or control event to initiate cache read of the stream of pages, and an intra-stream command to provide a non-sequential address before a preceding page in the sequence is output. As a result, a continuous read that includes a transition from sequential to non-sequential pages can be implemented without wait states, or with few wait states, on the interface during the outputs of the stream of pages.

A controller controls a continuous page read operation to output a stream of pages at the I/O interface. The continuous read operation includes responding to a series of commands to output a continuous stream of pages. The series of commands including a first command and one or more intra-stream commands received before completing output of a preceding page in the stream, such that intra-stream commands are received and decoded in a manner that can be interleaved with the output of the stream of pages. For non-sequential continuous page read operations, the first command can include an address to initiate the continuous page read operation for a plurality of pages having sequential addresses, and at least one intra-stream command includes a non-sequential address to provide a page having the non-sequential address in the stream of pages.

A technology is described in which a memory device has a controller that responds to an intra-stream command including the non-sequential address, by initiating a read to transfer the non-sequential page to the page buffer, and by providing a preceding page to the input/output interface in a manner that can be contiguous with, or can quickly follow, the last I/O cycle for the intra-stream command including the non-sequential address. Also, the non-sequential page command can follow a preceding page in the stream, where the preceding page has a page address that is included in a preceding intra-stream command in the series of intra-stream commands that precedes the page by one page in the stream. In another embodiment, the non-sequential page can follow the preceding page in the stream that precedes the page by two pages in the stream, where the preceding page provided to the input/output interface after the intra-stream command, including the non-sequential address, has a page address that is carried by a preceding intra-stream command that precedes the intra-stream command including the non-sequential address by two commands in the series of commands.

Examples of the technology are described in which the controller responds to a first command to initiate a continuous page read operation for a device including three-level buffering, to transfer a first addressed page in the stream from the memory array to the page buffer, and move the first addressed page through data path circuits to the interface. Also, the controller responds to a first intra-stream command after a first read latency including a next page address to transfer a next addressed page in the stream from the memory array to the page buffer, and move the next addressed page through the data path circuits to the interface. Also, the controller can respond to a second intra-stream command after a second read latency including a second next page address between output of the first addressed page from the interface.

In embodiments described herein, the data path circuits can include buffer memory. Also, the device can include error checking and correction ECC circuits connected to the data path circuits. The ECC circuits execute ECC functions on pages in the data path circuits before enabling output of the pages at the input/output interface of the device. The ECC circuits can operate with data chunks having an ECC chunk with less than the page width, and greater than the I/O width.

The data path circuits can include buffer memory including a first part and a second part, and data paths connecting the first part of the buffer memory, alternately to the ECC circuits and to the I/O interface, and connecting the second part of the buffer memory alternately to the ECC circuits and to the I/O interface.

Also, the data path circuits can include multilevel buffer memory, which in addition to the page buffer having a page width (X), include a second buffer level and a third buffer level. The third buffer level can include a first part and a second part, and data paths connecting the first part of the third buffer level alternately to the ECC circuits and to the I/O interface, and connecting the second part of the third buffer level alternately to the ECC circuits and the I/O interface. The first and second parts of the third buffer level can have a buffer width (Y) less than the page width (e.g. a multiple of the width of an ECC chunk), and the data path can have a bus width (Z) less than the buffer width for connecting the first and second parts of the third buffer level alternately to the ECC circuits and to the I/O interface.

A method for operating a memory for reading a stream of pages, including non-sequential pages, is described that includes responding to a series of commands to output a stream of pages from a memory, the series including a first command and one or more intra-stream commands, determining addresses of pages in the stream of pages using the first command for a first page address and the one or more intra-stream commands for subsequent page addresses; and receiving at least one intra-stream command in the one or more intra-stream commands before completing output of a preceding page in the stream, and wherein the at least one intra-stream command in the one or more intra-stream commands includes an address that is not sequential to the preceding page.

Embodiments are described in which the memory array comprises a page mode NAND flash. The technologies described herein can be applied to other types of memory devices as well.

Other aspects and advantages of the present invention can be seen on review of the drawings, the detailed description and the claims, which follow.

DETAILED DESCRIPTION

A detailed description of embodiments of the present invention is provided with reference to the FIGS. 1-11.

Figure 1:
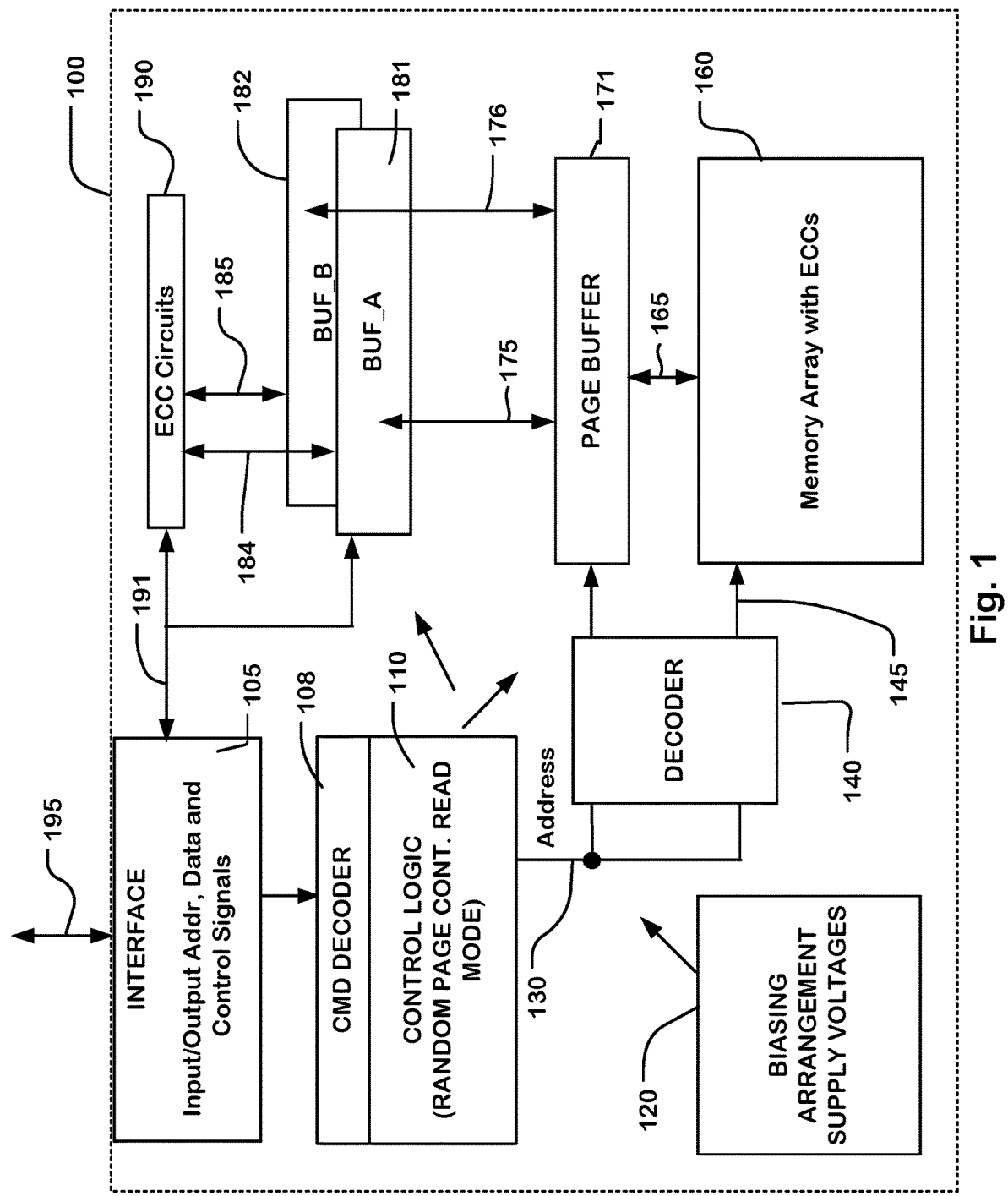
FIG. 1 is a simplified block diagram of an integrated circuit memory device supporting non-sequential page continuous read as described herein.

FIG. 1 is a simplified chip block diagram of an integrated circuit memory device according to an embodiment. The integrated circuit memory device 100 includes a memory array 160 that stores data with ECCs, such as a NAND flash array, on a single integrated circuit substrate. Memory devices as described herein can be implemented using multichip modules, stacked chips and other configurations as well.

Control logic 110 with a command decoder 108, on the integrated circuit memory device 100 includes logic, such as a state machine, responsive to received commands to execute non-sequential page continuous read operations as described herein, supporting continuous reads with random page addresses as described in more detail below. The control logic 110 outputs control signals, represented by arrows on the diagram, and addresses on bus 130. The addresses supplied on bus 130 can include for example outputs of an address counter (e.g., sequential addresses) in the control logic 110, or addresses carried in received commands which can include non-sequential addresses.

A decoder 140 is coupled to a plurality of word lines 145, and arranged along rows in the memory array with ECCs 160, and to a page buffer 171. The page buffer 171 is coupled to a plurality of bit lines 165 arranged along columns in the memory array with ECCs 160 for reading data from and writing data to the memory array with ECCs 160.

The page buffer 171 can include one or more storage elements for each bit line. The address decoder 140 can select and couple specific memory cells in the array 160 via respective connecting bit lines to the page buffer 171. The page buffer 171 can store data that is written to or read from these specific memory cells in parallel. The page buffer 171 can have a page width for pages including thousands of bits, such as 2K bits or 4K bits, or more with extra bits including associated ECC codes. One page can include a plurality of ECC chunks, wherein ECC chunks include a segment of data and an associated ECC code (i.e. having been computed for ECC over the segment of data). In embodiments, each page includes 2 ECC chunks having an ECC width equal to one-half page or one-fourth page, plus the size of the associated ECC codes. In some embodiments, there may be more than 2 ECC chunks per page.

A buffer memory structure in the data path circuits from the page buffer to the interface, in this embodiment includes two-level buffering, including the page buffer with a second buffer level, including two parts designated buffer BUF_A 181 and buffer BUF_B 182 in this example, where each part of the second buffer level can store a part, such as one-half, of the contents of the page buffer, where the part of the contents of the page buffer preferably include one or more ECC chunks. Also, each part of the second buffer level can be read from and written to independently. In some embodiments, the buffers BUF_A, BUF_B can be implemented using dual-port or multi-port memory technology, allowing independent reads and writes to different addresses, or can be implemented using multiple banks of memory, having separate address decoding and read out circuits.

The page buffer 171 is coupled with the memory array 160 via a number X data lines where X is a page plus ECC codes width, and with the second level buffers 181, 182 (BUF_A, BUF_B) of the buffer structure, via buses 175, 176 of Y bits each, where Y can be a width equal to a half or more of the width X of the page buffer 171. The second level buffers BUF_A, BUF_B can each be implemented with a cache memory, using SRAM (static random access memory) memory structures for example, that has a one row by multiple column architecture. For instance, a page can include 2048 bits+ECC codes, and BUF_A can have one row with 1024 (+ECC bits) columns or a width of 1024+ECC bits. The buffers BUF_A and BUF_B can be operated so that the page of data in the page buffer can be transferred to the buffers BUF_A and BUF_B in parallel, and in parallel using one buffer memory cycle. Also, the buffers BUF_A and BUF_B can be operated so that the one part of the page of data in the page buffer can be transferred to each one of the buffers BUF_A and BUF_B in parallel, allowing the transfer of a first part of the page to a first part (e.g. BUF_A) of the second buffer level, and the transfer of a second part of the page to a second part (e.g. BUF_A) of the second buffer level in the same or different buffer memory cycles.

Other embodiments can include three-level buffer structures including the page buffer 171 and two additional buffer levels. Also, other arrangements of buffer memory structures in the data path circuits between the page buffer and the interface can be used.

The third-level buffers can be implemented using SRAM based cache memory structures that have a multiple row by multiple column architecture. The first memory unit and the second memory unit of third-level buffers as described below, can have a width equal to the width of the data path.

Error checking and correction ECC circuits 190 are coupled to the buffer memory structure (181, 182) by data bus 184 and data bus 185. The data buses 184 and 185 can have a bus width less than an ECC chunk, such as one byte or one word, and are used by the ECC circuits 190 to cycle through ECC chunks to perform ECC operations of error checking and error correction (e.g. syndrome calculation, key calculation, Chien search). The ECC circuits are coupled by data bus 191 to the buffer memory structure (181, 182) for movement of data back and forth as necessary.

An I/O interface 105 is coupled to the ECC circuits and to the buffer memory structure (181, 182) by data bus 191.

Input/output data and control signals are moved among the interface 105, the command decoder 108 and the control logic 110, and input/output ports 195 on the integrated circuit memory device 100 or other data sources internal or external to the integrated circuit memory device 100. In some embodiments, the ports 195 can connect to on-chip host circuits, such as a general purpose processor or special purpose application circuitry, or a combination of modules providing system-on-a-chip functionality supported by the memory array 160.

In one embodiment, the interface 105 is a serial interface including a set of I/O ports 195 through which commands, addresses and data are communicated. The serial interface can be based on or compliant with a Serial Peripheral Interface (SPI) bus specification in which the command channel shares the I/O pins used by address and data. For example, the integrated circuit memory device 100 can include input/output ports using pins for receiving and transmitting SPI bus signals. One pin can be connected to an input data line carrying serial input data/address signal SI, usable for commands as well. Another pin, or multiple other pins, can be connected to an output data line or output data lines carrying serial output data signal SO. Another pin can be connected to a clock line carrying serial clock signal SCLK. Yet another pin can be connected to a control line carrying chip-enable or chip-select signal CS#.

Other types of interfaces, including parallel interfaces and other types of serial interfaces can be used as well. The I/O ports 195 on a particular integrated circuit memory device 100 can be configured to provide output data with an I/O data width, which can be, for some examples, 1, 4, 8, 16, 32 or more bits in parallel per interface clock (e.g. SCLK) cycle. The I/O interface 105 can include a FIFO buffer, a shift register buffer or other supporting circuits along with a transmitter for transmitting data received at the interface on ports at a port clock rate, such as an SCLK rate for an SPI interface.

In the example shown in FIG. 1, control logic 110 using a bias arrangement state machine controls the application of bias arrangement supply voltage generated or provided through the voltage supply or supplies in block 120, such as read, program and erase voltages including page read to transfer data from a page in the memory array to the page buffer. The control logic 110 is coupled to the multi-level buffer structure, the ECC circuits 190, and the memory array with ECCs 160.

The control logic 110 and command decoder 108 constitute a controller which can be implemented using special purpose logic circuitry including state machines and supporting logic. In alternative embodiments, the control logic comprises a general-purpose processor, which can be implemented on the same integrated circuit, which executes a computer program to control the operations of the device. In yet other embodiments, a combination of special-purpose logic circuitry and a general purpose processor can be utilized for implementation of the control logic.

The command decoder 108 and control logic 110 of the controller are configured to execute a continuous read operation for non-sequential pages, allowing a shift during a continuous read to random page addresses. In embodiments described herein, the controller is responsive to the commands received at the input/output interface, to control memory operations including a continuous page read operation to output a stream of pages at the I/O interface. The execution of a continuous read operation includes responding to a series of commands, the series including a first command, and one or more of intra-stream commands, where the intra-stream commands are defined herein as commands after the first command and received before completing output of a preceding page in the stream, while the preceding page in the stream is traversing the data path circuits including the buffer memory structure. The intra-stream commands can be received on a clock cycle contiguous with, or quickly following such after fewer than four interface clock cycles, the last output byte of a preceding page in the stream ahead of the page traversing the buffer memory structure.

Figure 2:
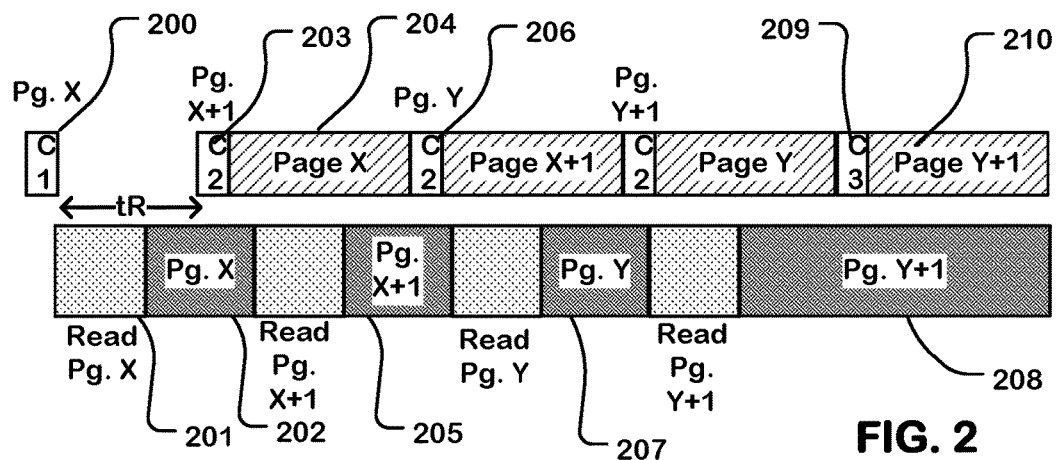
FIG. 2 is a diagram of a command sequence for non-sequential page continuous read as described herein.

FIG. 2 illustrates a non-sequential page continuous read, with two levels. The upper level illustrates a series of commands interleaved with pages of data in the stream of pages, at the I/O interface for a non-sequential page continuous read. The series of commands includes a first command C1 and a plurality of intra-stream commands C2 and C3. The lower level indicates operation of the page buffer during the execution of the non-sequential page continuous read.

In this example, the non-sequential page continuous read is initiated by receiving a first command C1 in interval 200 at the I/O interface. The first command C1 initiates a continuous read and provides a starting address of page X. In response to decoding of the command C1, the array is operated to read page X during interval 201, and page X data becomes available in the page buffer during interval 202. After the read latency tR during which the data of page X is loaded into the page buffer from the memory array and traverses the data path circuits to the interface, a second command C2 is received during interval 203 to provide a next page address. At the time of the second command, the data of the initial page (the first page in this stream of pages) is traversing the data path circuits, including the buffer memory structure, to the I/O interface. In this embodiment, the first page is available at the interface starting in an I/O cycle at the beginning of interval 204 and contiguous with the end of the second command C2 in interval 203. In this example, the next page address carried in C2 during interval 203 is a sequential address, page X+1.

After outputting the data of page X during interval 204, a second command C2 is received during interval 206, including a next page address, without idle cycles on the interface wait states on the interface. The second command is followed by the output of a preceding page X+1 (i.e. page addressed in a previous command). In this example, the next page address received during interval 206 is a non-sequential address, page Y. The command C2 during interval 206 is received before the data of page X+1 is output at the interface during interval 205. During interval 207, the memory is operated to move the data from page Y into the page buffer. The preceding page available on the I/O interface during the interval following the command C2 in interval 206, is page X+1.

After outputting the data of page X+1, a next command C2 is received on the I/O interface before outputting of the preceding page, Page Y, to provide the next page address, page Y+1. After the next page address Y+1 is received, the array is operated to move the data of page Y+1 into the page buffer during interval 208. This sequence can continue indefinitely. To terminate the continuous read sequence, a third command C3 is received in this example, in this example, during interval 209 at the end of outputting of the data of page Y on the I/O interface. The third command C3 does not provide an address, and the data from the preceding page Y+1 can be moved to the I/O interface in the following interval 210.

In embodiments described herein, the integrated circuit memory device includes ECC circuitry connected to the data path circuits including a buffer memory structure and the I/O interface. During the transfer of the data from the page buffer to the I/O interface, the ECC circuitry is utilized for error checking and correcting. The amount of time needed by the ECC circuitry to perform its functions is hidden by buffering in the data path circuits. This buffering can be provided by movement of the data into and out of buffer memory in the data path circuits.

In the example shown in FIG. 2, an intra-stream command C2 (continuous page cache read command) includes an address to identify the next address in the sequence, and output a preceding page for each page in the stream of pages. Thus, in this embodiment, at least part of the resources of the I/O interface during the continuous read operation, are consumed by receiving the intra-stream commands with addresses. However, because of the continuous read procedure, if the host providing the commands is ready at the end of the output of one page in the sequence, the command for the next page can be provided without idle cycles at the interface, and the page in the buffer can be output contiguous with (i.e., without idle cycles on the I/O interface) or quickly following, the last cycle of the command.

Figure 3:
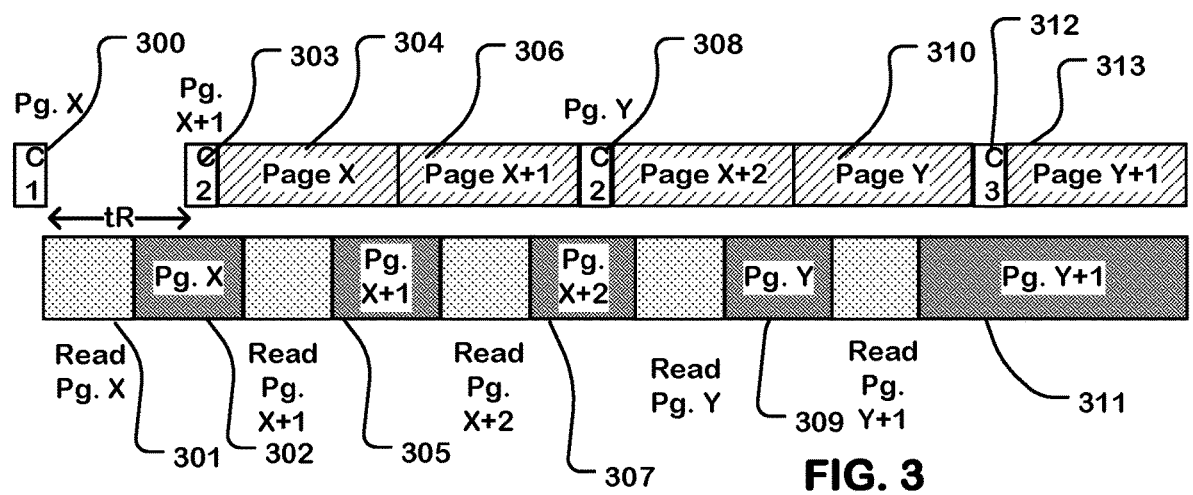
FIG. 3 is a diagram of an alternative command sequence for non-sequential page continuous read as described herein.

FIG. 3 illustrates an alternative example. Like FIG. 2, FIG. 3 includes two levels. The upper level illustrates a series of commands interleaved with pages of data in the stream of pages, at the I/O interface for a non-sequential page continuous read. The series of commands includes a first command C1 and a plurality of intra-stream commands C2 and C3. The lower level indicates operation of the page buffer during execution of the non-sequential page continuous read. As shown, for sequential pages in this example, it is not necessary to provide an intra-stream command to output each page. Rather, the controller can check for a command carrying a next address, and if none is present at the time, then it can continue to provide pages in the stream with sequential addresses automatically using an address counter. The time required to check for a command between outputting of pages can be very short, such as one interface clock cycle, or less than four interface clock cycles.

In the example of FIG. 3, the non-sequential page continuous read is initiated by receiving a first command C1 in interval 300 at the I/O interface. The first command C1 indicates a continuous read and provides a starting address of page X. In response to decoding of the command C1, the array is operated to read page X during interval 301, and page X data becomes available in the page buffer during interval 302. After the read latency tR, during which the data of the page is loaded into the page buffer from the memory array and moved through the buffer memory system to the interface, a second command C2 is received during interval 303 to provide a next page address, followed by output of the data of the first page during the contiguous interval 304 using the I/O interface. In this example, the next page has a sequential address, page X+1. After receiving the second command C2 during interval 303, the memory is operated to load the data of page X+1 into the page buffer in interval 305, and the data is moved through the data path circuits to the I/O interface to be output during interval 306, which is contiguous with interval 304. In this example, the next address to be output is a sequential address, page X+2, and it can be loaded into the page buffer in interval 307. Because the addresses X+1 and X+2 are sequential, the address can be provided by an address counter in the controller rather than by an additional command, saving resources at the I/O interface. The controller can be operated to monitor the command interface for an intra-stream command before initiating a page read from the array to move a next page to the page buffer. If a page address is provided by an intra-stream command, then that address is utilized. If there is no intra-stream command, then the controller can use an output of an address counter to select a sequential page.

To provide a non-sequential address, a next intra-stream command C2 is provided during interval 308 at the end of interval 306, and before outputting the preceding page X+2. In this example, the next command C2 in interval 308 carries a non-sequential address, page Y. The data of page Y is loaded into the page buffer during interval 309, and moved to the I/O interface for output during interval 310, which is contiguous with the preceding page, page X+2. While page Y is being output during interval 310, the memory can be operated to load the data of the next page Y+1 into the page buffer in interval 311. Pages can then be output sequentially in this manner until receipt of a third command C3, in this example in interval 312, to terminate the sequential read, and output the final page in the sequence, in this example page Y+1 during interval 313.

Figure 4:
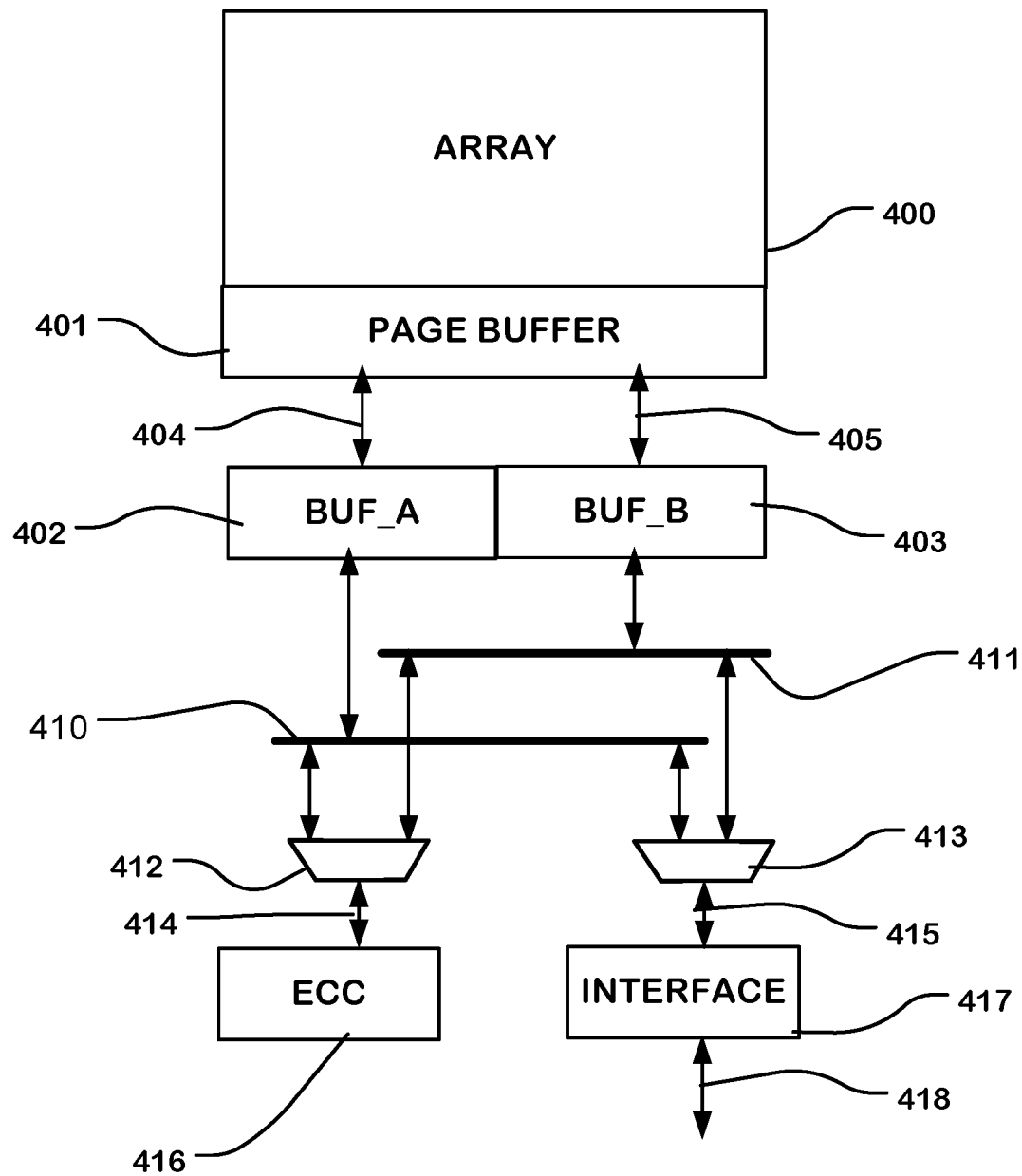
FIG. 4 is a block diagram showing two-level buffering for a device supporting non-sequential page continuous read as described herein, with ECC.

FIG. 4 is a block diagram illustrating a memory array and data path circuitry including ECC circuits operable for non-sequential page continuous read as described with reference to FIGS. 2 and 3 with two-level buffering (page buffer/buffer BUF_A, buffer BUF_B). This is one example of a circuit organization that can be utilized for example in the integrated circuit memory device 100 shown in FIG. 1.

In FIG. 4, a memory array 400, such as a NAND flash array is coupled to a page buffer 401. Data can move from the memory array 400 to the page buffer 401 in parallel during a single page read operation. The page buffer 401 is coupled to the data path circuits including buffer BUF_A 402, and buffer BUF_B 403 by bus 404 and bus 405, respectively. The bus 404 can have a data width that is half the width+ECCs of the page buffer 401, for transfer of one half of a page from the page buffer 401 to buffer BUF_A in a single cycle. Likewise, the bus 405 can have a data width that is half the width of the page buffer 401, for transfer of one half of the page from the page buffer 401 to buffer BUF_B in a single cycle. ECC bits can be included in the BUF_A and buffer BUF_B, or additional memory elements can be used for ECC bit in parallel with BUF_A and buffer BUF_B.

Buffer BUF_A and buffer BUF_B are in advantageous embodiments configured to hold at least one ECC chunk, including the data and ECC code associated with the data so that it can be operated on by ECC circuits 416 independently of data in the other buffer.

As illustrated, the data path circuits include a bus 410 connected to buffer BUF_A, and a bus 411 connected to buffer BUF_B. The bus 410 connected to a multiplexer 412 and to a multiplexer 413. Likewise, the bus 411 is connected to the multiplexer 412 and to the multiplexer 413. The output of the multiplexer 412 is connected by line 414 to the ECC circuits 416. The output of the multiplexer 413 is connected by line 415 to the I/O interface 417, which provides the output data for the addressed pages. Data can be moved on the bus 410 and the bus 411 by addressable units such as bytes or words that are supportable by the buses 410, 411, for use by the ECC circuits 416 and for output by the interface 417 on I/O ports 418.

Figure 5:
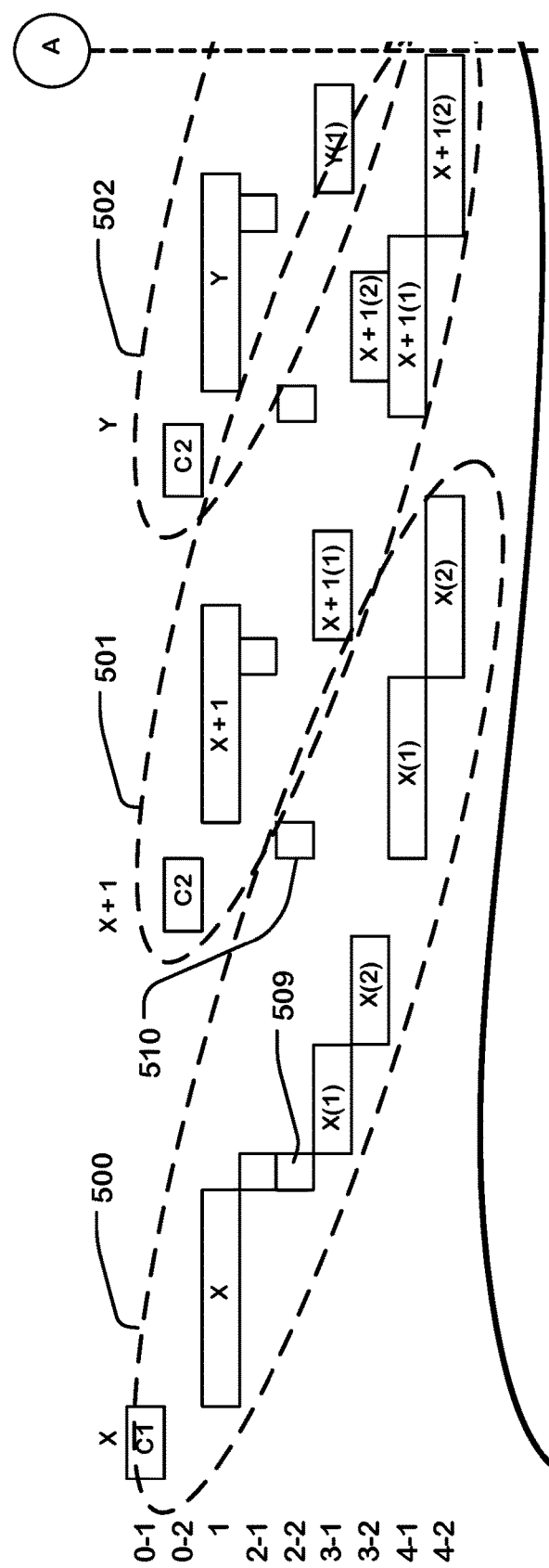
FIG. 5 is a pipeline dataflow diagram for one embodiment of a non-sequential page continuous read as described herein with two-level buffering.
Figure 5:
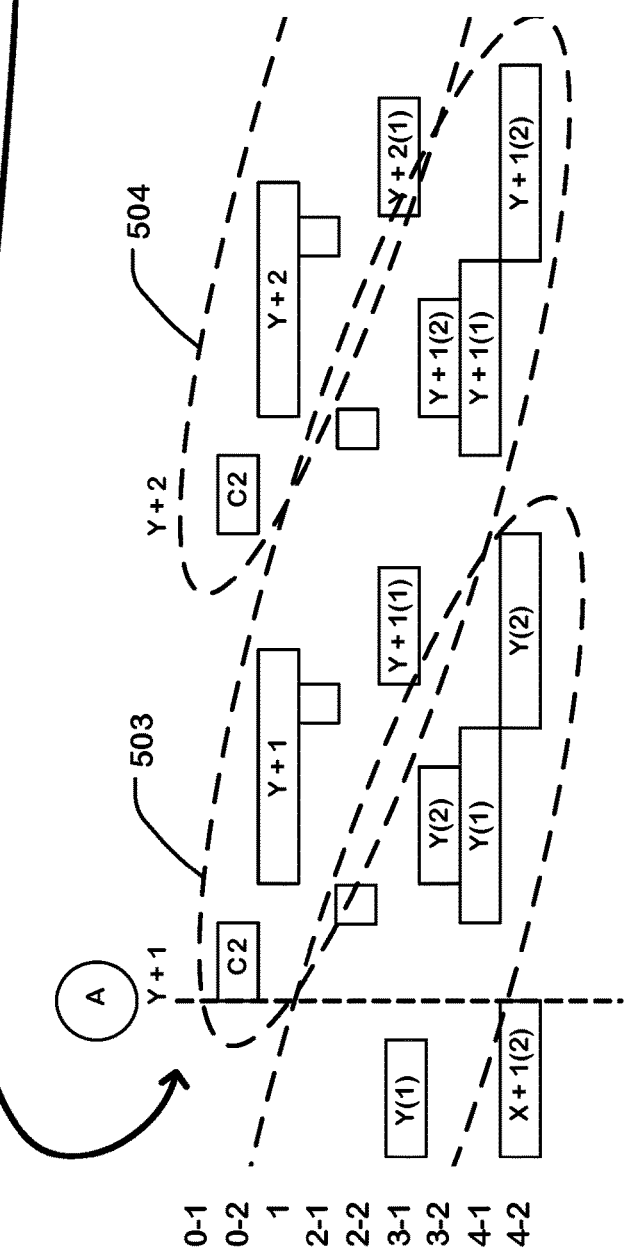

FIG. 5 is a diagram that illustrates the pipeline data flow for a non-sequential page continuous read like that of FIG. 2, implemented using a state machine and supporting logic in the controller for the device, for a non-sequential page continuous read utilizing data path circuitry having two buffer levels (page buffer/buffer BUF_A, buffer BUF_B) like that of FIG. 4. In the diagram, the horizontal axis represents time, each vertical level corresponds to a particular data movement as follows:

0-1: receive page read command C1 for a new page.
0-2: receive read from cache intra-stream command C2 to read the data.
1: move the page data and ECCs from the memory array to the page buffer (both halves).
2-1: move the data from the first half of the page buffer to buffer BUF_A.
2-2 move the data from the second half of the page buffer to buffer BUF_B.
3-1: apply ECC logic for error detection and correction in buffer BUF_A.
3-2: apply ECC logic for error detection and correction in buffer BUF_B.
4-1: move the data from buffer BUF_A to the data path in the I/O interface.
4-2: move the data from buffer BUF_B to the data path in the I/O interface.

The end of sequence command is not illustrated in FIG. 5. It can be implemented as discussed above. Also, other embodiments can signal an end of sequence with control signals other than a command.

In FIG. 5, a first command C1 is received at the beginning at level 0-1 providing the beginning address of page X. Proceeding diagonally down to level 4-2 as indicated by the elements within region 500 for page X, the data of page X loaded into the page buffer at level 1. From the page buffer a first half X(1) of the page is loaded into buffer BUF_A at level 2-1. Also, at a later time (or simultaneously) a second half X(2) of the page is loaded into buffer BUF_B at level 2-2.

In the figures, the notations (1) and (2) denote first and second parts of a page, respectively. So X(1) is a first part of page X and X(2) is a second part of page X.

For the first page in the sequence, assuming the buffer BUF_B is available, this transfer of the second half of the first page to BUF_B at level 2-2 can be executing either at the same time as the transfer of the first half of the first page to BUF_A at level 2-1 as indicated by box 509, or it can happen later, as indicated by box 510. At level 3-1, while the first half of page X is in buffer BUF_A, ECC circuitry is exercised over the ECC chunk or chunks in the first half of the page. Later at level 3-2, while the second half of page X is in buffer BUF_B, the ECC is exercised over the ECC chunk or chunks in the second half of the page. Finally at level 4-1, the first half of page X is provided to the I/O interface to be provided as output when the cache read command C2 is received at level 0-2. At level 4-2, the second half of page is provided to the I/O interface continuous with the first half.

As described herein, the intra-stream command C2 (read from cache) can carry an address of a next page in the continuous read sequence. A sequence of continuous reads (regions 501, 502, 503, 504 . . . ) can be executed in this sequence, responding to a series of commands to output a stream of pages. The command C2 including address X+1 is received at level 0-2 in this flow before beginning to output the data from page X to the interface at level 4-1. Also, the output of the data from page X to the interface at level 4-1 begins contiguously with the end of the C2 command.

Using an intra-stream command C2 in this manner, a non-sequential address can be provided while maintaining the continuous read sequence. In FIG. 5 this is illustrated by the address sequences beginning at page X (500), while the next C2 command provides address X+1 (501), and the next C2 command provides non-sequential address Y (502). The following C2 command provides address Y+1 (503) in this example. The continuous read in this example continues with a next C2 command providing address Y+2 (504). The continuous read can proceed until termination.

The procedure shown in FIG. 5 is an example of the controller responding to a series of commands to output a stream of pages. The controller responds to the first command to initiate a continuous page read operation, to transfer a first addressed page in the stream from the memory array to the page buffer, and move the first addressed page through the data path circuits to the interface. The controller responds to a first intra-stream command received after a read latency and including a next page address to access the memory for a following page and to move it through the data path circuits while outputting the first addressed page from the interface in I/O data units. The controller responds to subsequent intra-stream commands which can include a next page address to access the memory during output of a preceding page from the interface. In this example with two level buffering, the preceding page has a page address included in a preceding intra-stream command in the plurality of intra-stream commands that precedes said intra-stream command including the non-sequential address by one page in the stream of pages.

Figure 6:
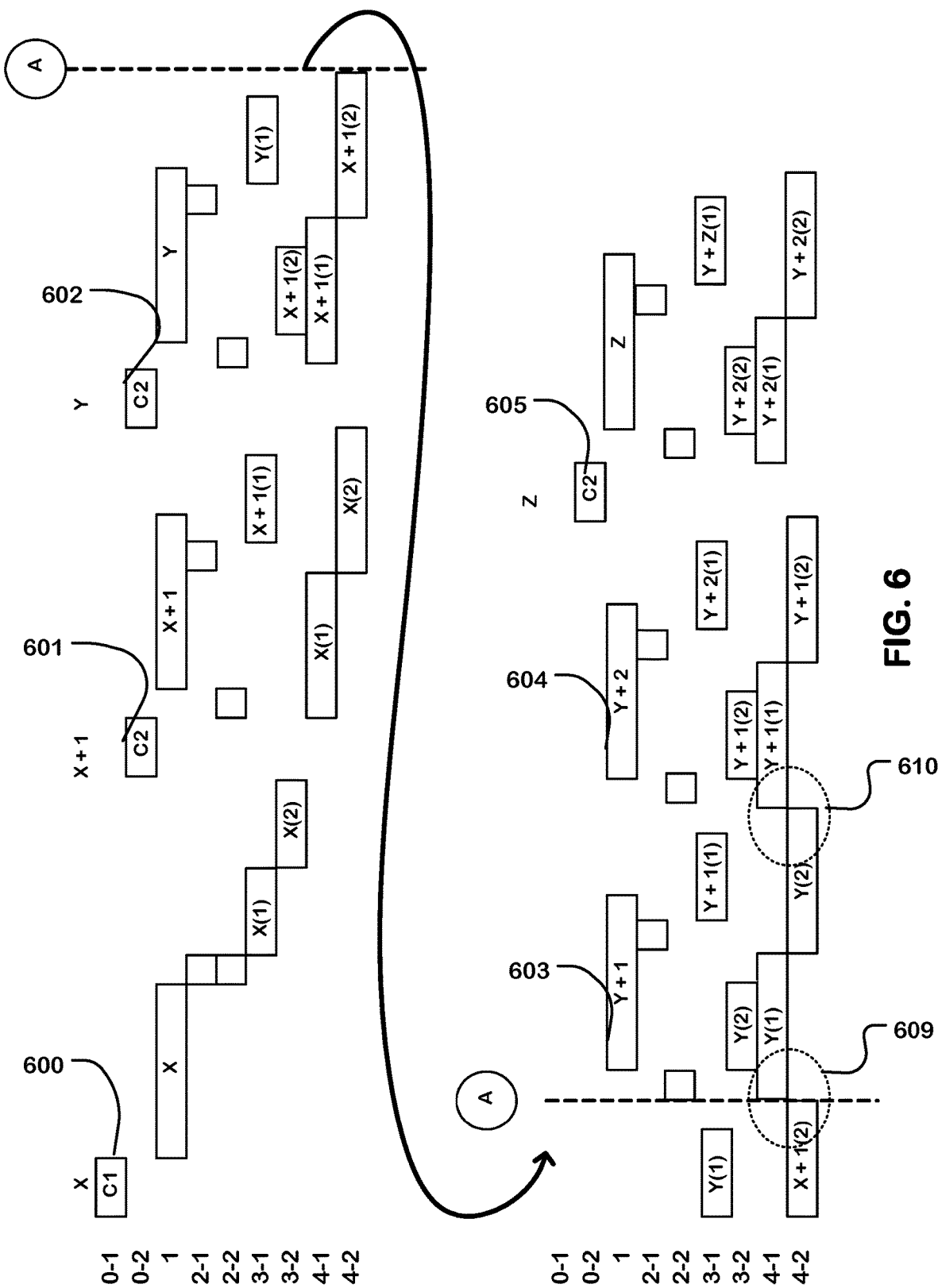
FIG. 6 is a pipeline dataflow diagram for an alternative embodiment of a non-sequential page continuous read as described herein with two-level buffering.

FIG. 6 is a diagram that illustrates the pipeline data flow for a non-sequential page continuous read like that of FIG. 2, implemented using a state machine and supporting logic in the controller for the device, for a non-sequential page continuous read utilizing data path circuitry having two buffer levels (page buffer/buffer BUF_A, buffer BUF_B) like that of FIG. 4, in which intra-stream commands after the first intra-stream command 601, are not used to provide sequential addresses. In the diagram, the horizontal axis represents time, each vertical level corresponds to a particular data movement as follows:

- 0-1: receive page read command C1 for a new page.
- 0-2: receive read from cache intra-stream command C2 to read the data.
- 1: move the page data and ECCs from the memory array to the page buffer (both halves).
- 2-1: move the data from the first half of the page buffer to buffer BUF_A.
- 2-2 move the data from the second half of the page buffer to buffer BUF_B.
- 3-1: apply ECC logic for error detection and correction in buffer BUF_A.
- 3-2: apply ECC logic for error detection and correction in buffer BUF_B.
- 4-1: move the data from buffer BUF_A to the data path in the I/O interface.
- 4-2: move the data from buffer BUF_B to the data path in the I/O interface.

The end of sequence command is not illustrated in FIG. 6. It can be implemented as discussed above, including a page read command 600, followed by one or more intra-stream commands 601, 602, 603, 604, 605. Also, other embodiments can signal an end of sequence with control signals other than a command.

FIG. 6 is distinct from FIG. 5 in that after the C2 command 602, the stream of pages includes sequential addresses Y, Y+1, and Y+2, and then a non-sequential address 605 Z. Thus, after the C2 command 602 providing address Y, the controller accesses a page at address Y+1 using an internal address counter without a command, and then accesses a page at address Y+2 using the internal address counter without a command. This enables better throughput, because data flow is not interrupted, or not interrupted long enough to receive command at times 609 and 610.

Figure 7:
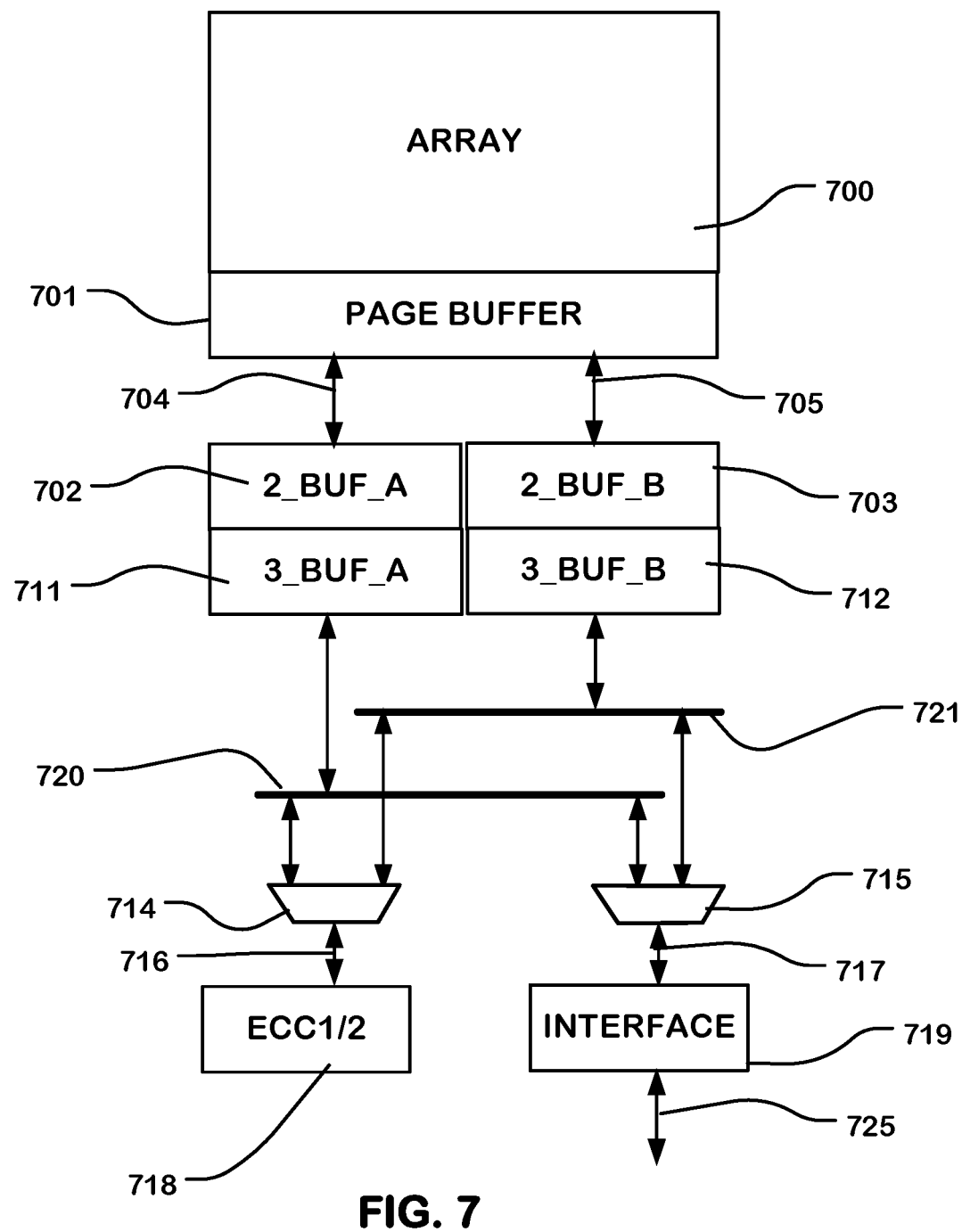
FIG. 7 is a block diagram showing three-level buffering for a device supporting non-sequential page continuous read as described herein, with ECC.

FIG. 7 is a block diagram illustrating a memory array, and data path circuitry including ECC circuits operable for non-sequential page continuous reads as described herein with three-level buffering (page buffer/buffer BUF_2_A, buffer BUF_2_B/buffer BUF_3_A, buffer BUF_3_B). This is another example of a circuit organization that can be utilized for example in integrated circuit memory device 100 of FIG. 1. The second and third buffer levels can be implemented using SRAM and cache technologies as discussed above in connection with FIG. 1.

In FIG. 7, a memory array 700, such as a NAND flash array, is coupled to a page buffer 701. Data can move from the memory array 700 to the page buffer 701 in parallel during a single read operation. The page buffer 701 is coupled to the data path circuits including a second level buffer, including buffer BUF_2_A (702) and buffer BUF_2_B (703), by bus 704 and bus 705. The bus 704 can have a data width that is half the width of a page buffer 701 (including ECC bits), for transfer of one half of the page from the page buffer 701 to buffer BUF_2_A in a single cycle. Likewise, the bus 705 can have a data width that is half the width of the page buffer 701, for transfer of one half of the page from page buffer 701 to buffer BUF_2_B in a single cycle.

The second level buffer, buffer BUF_2_A, is coupled to the third-level buffer, buffer BUF_3_A (711), by a data path that can have the same width (i.e. one half of the page) as bus 704 enabling transfer of data from buffer BUF_2_A to buffer BUF_3_A in a single cycle. Likewise, buffer BUF_2_B is coupled to buffer BUF_3_B (712) by a data path that can have the same width (i.e. one half of the page) as bus 705, enabling transfer of data from buffer BUF_2_B to buffer BUF_3_B in one cycle. In some embodiments, the second level buffer can have the same width as the page buffer, and may include a single buffer structure rather than a divided structure as illustrated here.

As illustrated, the data path circuits include a bus 720 connected to buffer BUF_3_A, and a bus 721 connected to buffer BUF_3_B. The bus 720 connected to a multiplexer 714 and to a multiplexer 715. Likewise, the bus 721 is connected to the multiplexer 714 and to the multiplexer 715. The output of the multiplexer 714 is connected by line 716 to the ECC circuits 718. The output of the multiplexer 715 is connected by line 717 to the I/O interface 719, which provides the output data for the addressed pages on ports 725. Data can be moved on the bus 720 and the bus 721 by addressable units such as bytes or words that are supportable by the buses 720, 721, for use by the ECC circuits 718 and for output by the interface 719 on ports 725. The ECC circuit 718 can include a first ECC function circuits, and second ECC function circuits which can be utilized alternatively using the buffer BUF_2_A/buffer BUF_2_B; buffer BUF_3_A/buffer BUF_3_B structures. In some embodiments, the bus 720 and the bus 721 can be coupled to both the second and third buffer levels, including the buffer BUF_2_A/buffer BUF_2_B, and the buffer BUF_3_A/buffer BUF_3_B structures.

Figure 11:
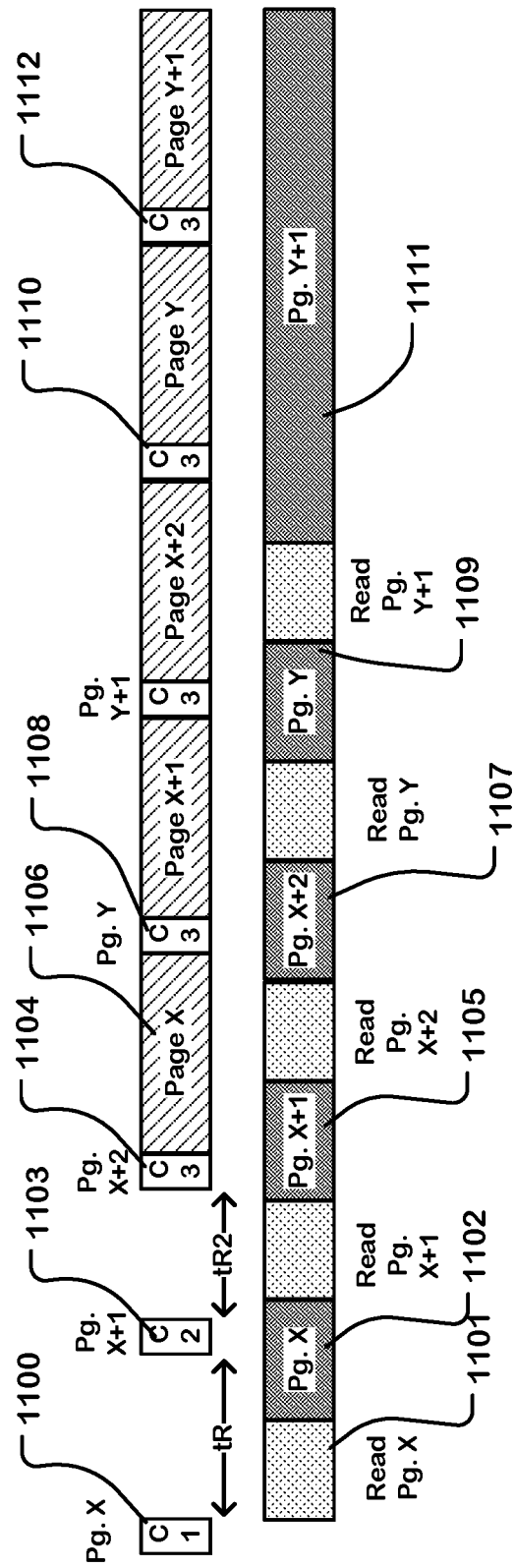
FIG. 11 is a diagram of a command sequence for non-sequential page continuous read as described herein for the alternative described in FIG. 10.

In a three-level buffering system like that of FIG. 7, a three-stage non-sequential page continuous read operation like that shown in FIG. 11 can be executed, enabling use of a higher-speed output clock on the I/O interface for example.

Figure 8:
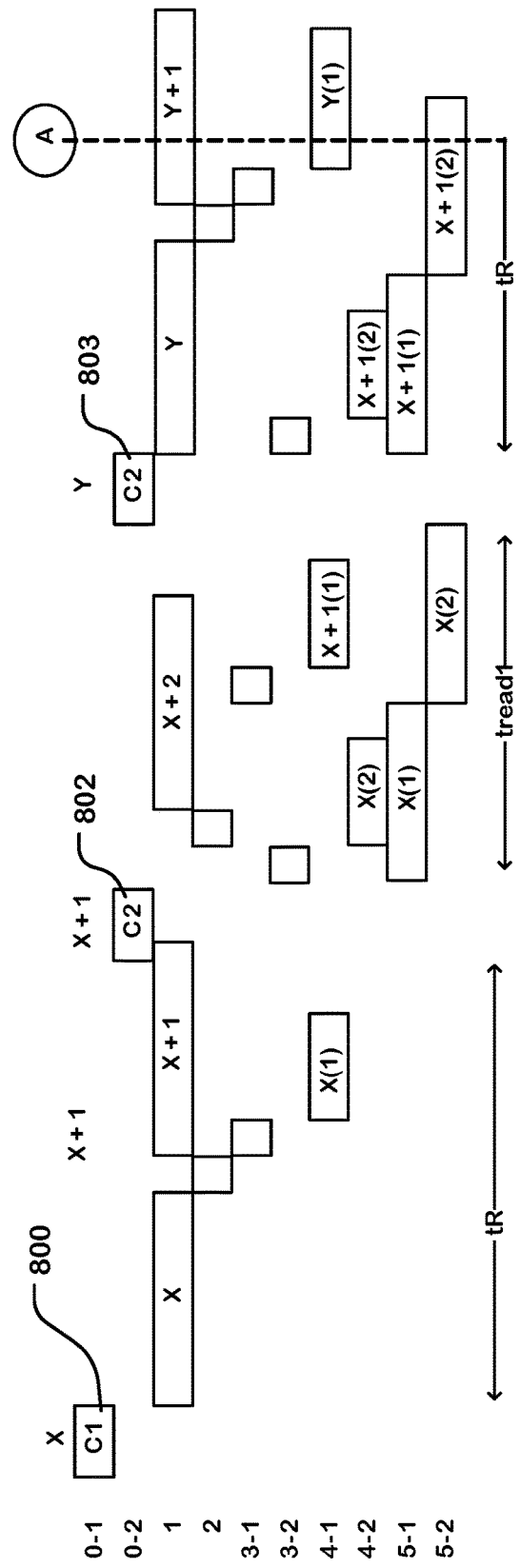
FIG. 8 is a pipeline dataflow diagram for one embodiment of a non-sequential page continuous read as described herein with three-level buffering.
Figure 8:
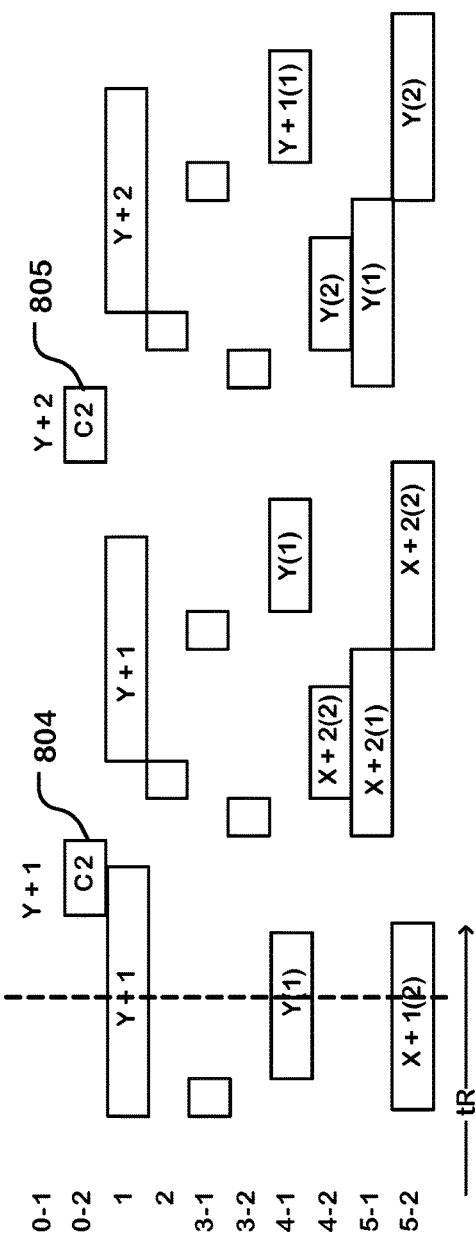

FIG. 8 is a diagram that illustrates the data flow for a non-sequential page continuous read like that of FIG. 7, implemented using a state machine and supporting logic in the controller for the device, for a non-sequential page continuous read utilizing data path circuitry having three buffer levels (page buffer/buffer BUF_2_A, buffer BUF_2_B/buffer BUF_3_A, buffer BUF_3_B) like that of FIG. 6. In the diagram, the horizontal axis represents time, each vertical level corresponds to a particular data movement as follows:

0-1: receive first page read command C1 for a first page.
0-2: receive intra-stream page read command C2 with page address
1: move the page data and ECCs from the memory array to the page buffer (both halves).
2: move the page data from the page buffer to buffer BUF_2_A and buffer BUF_2_B.
3-1: move the data from the first half of the page in buffer BUF_2_A to buffer BUF_3_A.
3-2 move the data from the second half of the page in buffer BUF_2_B to buffer BUF_3_B.
4-1: apply ECC logic for error detection and correction in buffer BUF_3_A.
4-2: apply ECC logic for error detection and correction in buffer BUF_3_B.
5-1: move the data from buffer BUF_3_A to the data path in the I/O interface.
5-2: move the data from buffer BUF_3_B to the data path in the I/O interface.

The end of sequence command is not illustrated in FIG. 8. It can be implemented as discussed above.

In FIG. 8, a first continuous read command C1 is received in interval 800 at the level 0-1 identifying a first page, page X, for the sequence. Proceeding diagonally down to level 5-2 for page X, the data of page X is loaded into the page buffer at level 1. From the page buffer, the data of page X is loaded into the second buffer level, including buffer BUF_2_A and buffer BUF_2_B in a single transfer at level 2 of the figure in this embodiment before data from the next page is loaded to the page buffer. Subsequently, at level 3-1, the data X(1) from buffer BUF_2_A is transferred to buffer BUF_3_A in the second buffer level. Thereafter, or simultaneously, at level 3-2 the data X(2) from buffer BUF_2_B is transferred to buffer BUF_3_B in the second buffer level.

In level 4-1, the ECC circuitry operates on the ECC chunks X(1) of page X in buffer BUF_3_A. At level 4-2, the ECC circuitry operates on the ECC chunks X(2) of page X in buffer BUF_3_B.

Thereafter, at level 5-1, the data X(1) of page X in buffer BUF_3_A is available at the interface in a manner that is synchronous with the receipt of the intra-stream command C2 at interval 802 in this example.

At level 5-2, the data X(2) of page X in buffer BUF_3_B is available at the interface in a manner that is synchronous with the output of the data from buffer BUF_3_A of page X.

After the first continuous read command C1 in interval 800, the data of page X is moved quickly to the second level buffer at level 2, and then the first half of page X is moved to the third-level buffer at level 3-1. This clears the page buffer to receive page X+1, accessed using a sequential address provided by the controller.

A plurality of continuous read commands C2 follow, including C2 commands in intervals 802, 803, 804 and 805. The second continuous read command C2 in interval 802 in this example carries a sequential page address, for page X+2. After the data of page X+1 is moved out of the page buffer, into the data path circuits, the data of page X+2 is moved into the page buffer.

After the second continuous read command C2 is received, a third continuous read command C2 including a next address (in this example the non-sequential address of page Y) is received at interval 803. After the C2 command, a readout of the first part of the page (two pages preceding Y in the stream) addressed by the first continuous read command C1, from the buffer BUF_3_A. Page X+1 remains in the data path.

As illustrated in FIG. 8, the data of page X+1 traverses the data path circuits so it is available after operation of the ECC circuits at the I/O interface in a manner that is synchronous with the C2 command received at interval 803.

The procedure continues in a pipelined manner through the data path circuits as illustrated in FIG. 8 until the continuous read operation is terminated.

FIG. 8 shows a latency tR, in which the host waits after issuing the C1 command, or a C2 command with a non-sequential address, before issuing a C2 command, and an interval tread1 required to output a page on the interface. In some embodiments, tR maybe longer than tread1, in which case introducing a non-sequential address can hurt throughput slightly.

Figure 9:
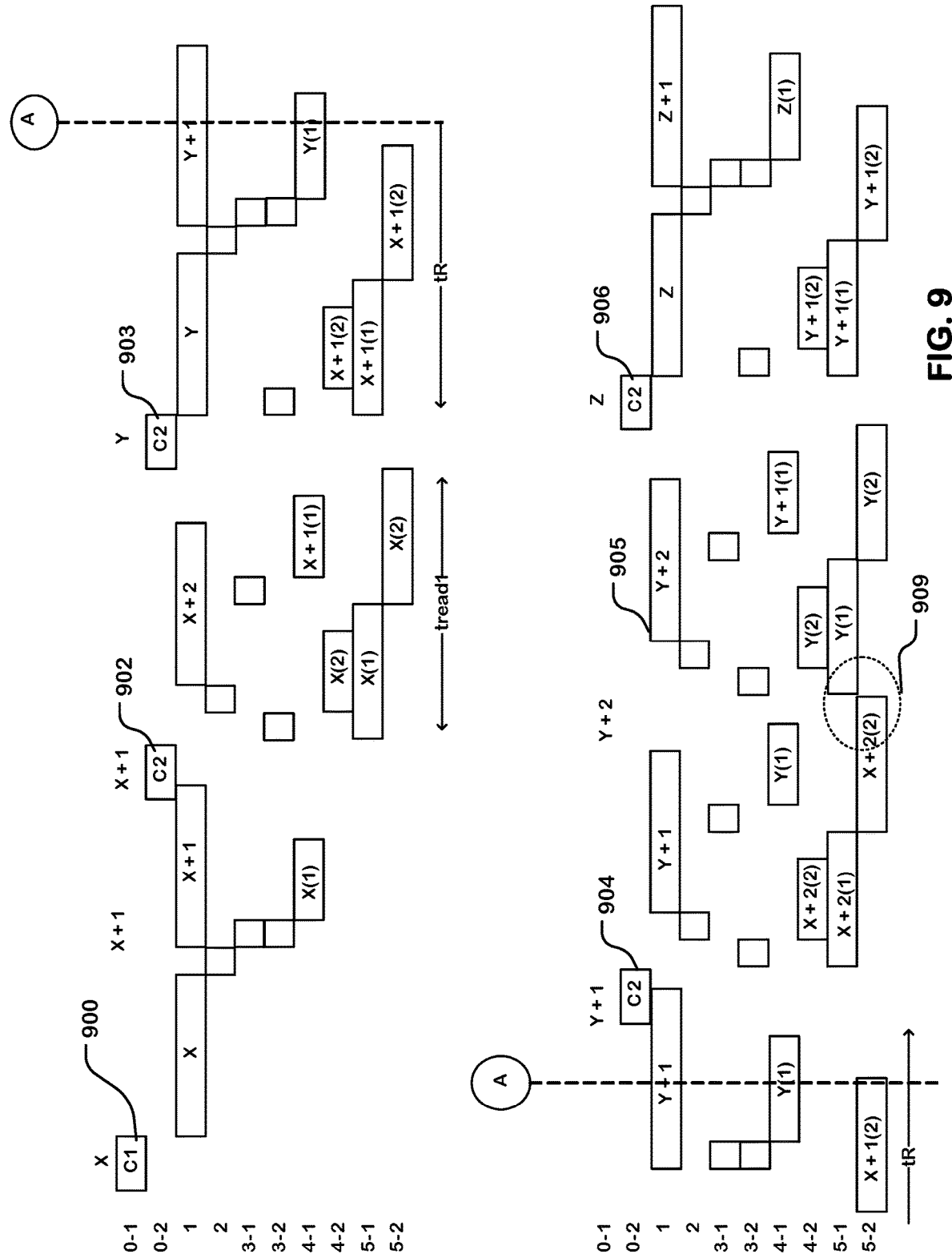
FIG. 9 is a pipeline dataflow diagram for an alternative embodiment of a non-sequential page continuous read as described herein with three-level buffering.

FIG. 9 is a diagram that illustrates the pipeline data flow, implemented using a state machine and supporting logic in the controller for the device, for a non-sequential page continuous read utilizing data path circuitry having three buffer levels like that of FIG. 7, including a page read command 900, followed by one or more intra-stream commands 901, 902, 903, 904, 906 in which intra-stream commands after the first intra-stream command 902 or after an intra-stream command 904 following a non-sequential address, are not used to provide sequential addresses. Thus page Y+2 is loaded to the page buffer in interval 905 without an intra-stream command. In the diagram, the horizontal axis represents time, and each vertical level corresponds to a particular data movement as follows:

0-1: receive first page read command C1 for a first page.
0-2: receive intra-stream page read command C2 with page address
1: move the page data and ECCs from the memory array to the page buffer (both halves).
2: move the page data from the page buffer to buffer BUF_2_A and buffer BUF_2_B.
3-1: move the data from the first half of the page in buffer BUF_2_A to buffer BUF_3_A.
3-2 move the data from the second half of the page in buffer BUF_2_B to buffer BUF_3_B.
4-1: apply ECC logic for error detection and correction in buffer BUF_3_A.
4-2: apply ECC logic for error detection and correction in buffer BUF_3_B.
5-1: move the data from buffer BUF_3_A to the data path in the I/O interface.
5-2: move the data from buffer BUF_3_B to the data path in the I/O interface.

The end of sequence command is not illustrated in FIG. 9. It can be implemented as discussed above. Also, other embodiments can signal an end of sequence with control signals other than a command.

FIG. 9 is distinct from FIG. 8 in that after the C2 command 903, the stream of pages includes sequential addresses Y, Y+1, and Y+2, and then a non-sequential address 906 Z. Thus, after the C2 command 903 providing address Y, the controller accesses a page at address Y+1 using an internal address counter before the command C2 including address Y+1, and then accesses a page at address Y+2 using the internal address counter without a command.

This enables better throughput, because data flow is not interrupted, or not interrupted long enough to receive a command at time 909 and other times between sequential addressed pages in the stream.

Figure 10:
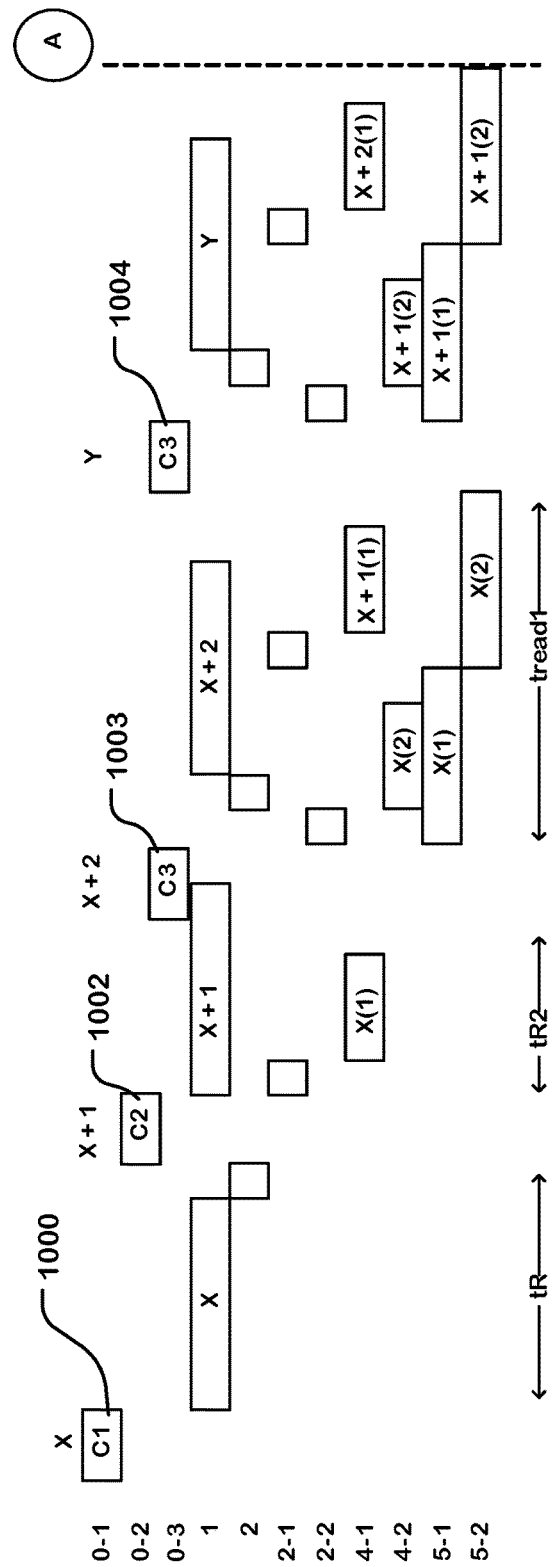
FIG. 10 is a pipeline dataflow diagram for another alternative embodiment of a non-sequential page continuous read as described herein with three-level buffering.
Figure 10:
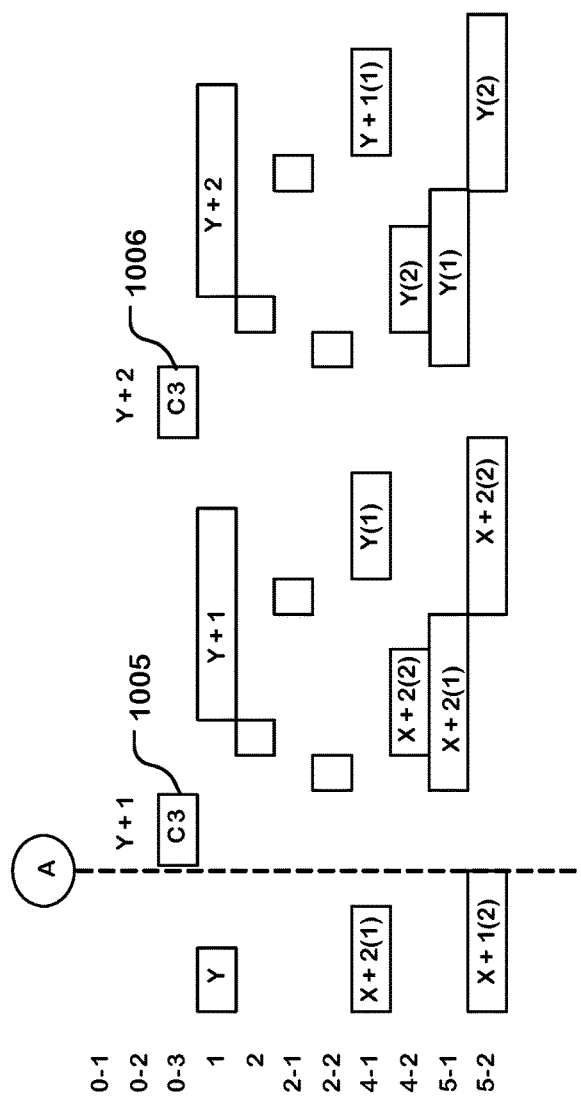

FIG. 10 is pipeline data flow for yet another embodiment of a non-sequential page continuous read utilizing data path circuitry having three buffer levels like that of FIG. 7, in which throughput can be improved using three command levels. In the diagram, the horizontal axis represents time, each vertical level corresponds to a particular data movement as follows:

0-1: host issues and controller receives first page read command C1 for a first page.
0-2: host issues and controller receives intra-stream continuous page read command C2 with address for second page
0-3: host issues and controller receives intra-stream continuous page read command C3 with page address with next succeeding page address
1: move the page data and ECCs from the memory array to the page buffer (both halves).
2: move the page data from the page buffer to buffer BUF_2_A and buffer BUF_2_B.
3-1: move the data from the first half of the page in buffer BUF_2_A to buffer BUF_3_A.
3-2 move the data from the second half of the page in buffer BUF_2_B to buffer BUF_3_B.
4-1: apply ECC logic for error detection and correction in buffer BUF_3_A.
4-2: apply ECC logic for error detection and correction in buffer BUF_3_B.
5-1: move the data from buffer BUF_3_A to the data path in the I/O interface.
5-2: move the data from buffer BUF_3_B to the data path in the I/O interface.

In this pipeline flow, implemented using a state machine and supporting logic in the controller for the device, a first read command C1 1000 is received carrying address X, and then after a latency tR, a second continuous read command C2 1002 carrying address X+1 is received. In this way, the array is not accessed for page X+1 until the command C2 1002 is received and decoded. Thereafter, the host waits for latency tR2, and issues a third continuous read command C3 1003 carrying a next address for the stream. The command C3 can be issued again at times 1004, 1005 and 1006 by the host with the interval tread1 between commands, even for non-sequential addresses, and obtain the next address for the stream until termination.

FIG. 11 illustrates a data flow for an embodiment, like the embodiment of FIG. 10, of a non-sequential page continuous read operation for a three-level buffering system, in a format like that of FIG. 2 and FIG. 3. Thus, FIG. 11 includes two levels. The upper level illustrates a series of commands for a non-sequential page continuous read. The lower level indicates operation of the page buffer during execution of the non-sequential page continuous read.

In the example of FIG. 11, the non-sequential continuous read is initiated by receiving a first command in interval 1100 at the I/O interface. The first command C1 initiates a continuous read, and provides a starting address of page X. In response to decoding of the command C1, the array is operated to read page X during interval 1101, and page X data becomes available in the page buffer during interval 1102. After the read latency tR, during which the data of page X is loaded into the page buffer from the memory array, an intra-stream command C2 is received during interval 1103 using the I/O interface. In this example, the next page address is carried with the intra-stream command C2 indicating page X+1, before the array is accessed for the next page in the sequence. After receiving the intra-stream command C2 during the interval 1103, the memory is operated to load the data of page X+1 into the page buffer in interval 1105. Meanwhile, the data of page X is moved through the data path circuits (e.g., buffer BUF_2_A, buffer BUF_2_B, buffer BUF_3_A, buffer BUF_3_B). After a second latency tR2 allowing for movement of the data through the three-level data path circuits, a second intra-stream command C3 (cache read) is received in interval 1104 using the I/O circuits. The second intra-stream command C3 carries a next page address in the continuous page operation, which in this example is page X+2 and is sequential with the preceding page. Meanwhile, the data of page X+1 is moved into the page buffer in interval 1105. After the second intra-stream command C3, a cache read operation is executed providing the data of page X on the I/O interface in interval 1106. At the end of interval 1106, a next intra-stream command C3 (cache read) is received on the I/O interface in interval 1108 including the next address (page Y), before the array is accessed for the next page in the sequence, and outputting the data of page X+1 begins, which was addressed with a command at interval 1103 received two commands before the current command.

In this example, the next address carried in the cache read intra-stream command of interval 1108 is non-sequential page Y. While the data of page X+1 is output on the interface, the data of the next page X+2 is loaded into the page buffer in interval 1107 and begins traversing the data path circuits. The data of page Y is loaded into the page buffer during interval 1109. Thus, the next command C3 can carry the address of page Y+1, and the data of page Y+1 can be loaded into the page buffer during interval 1111.

As illustrated in FIG. 11, between outputting of pages, a next intra-stream command C3 (cache read) including the next page address (e.g. page Y+1) is provided continuous with the output on the I/O interface of a preceding page (by two pages) in the stream of pages (e.g. page X+1). In this example, the preceding page has a page address included in a preceding intra-stream command in the plurality of intra-stream commands that precedes said intra-stream command including the non-sequential address by two commands in the series of commands.

This procedure is continued until a first termination command is received (not shown).

A device having a controller, and a method responsive to a command sequence for continuous read including non-sequential pages, are described herein.

A device having a controller, and a method for continuous read of non-sequential pages, are described, including accepting a first command specifying a starting address, and outputting sequential pages in response, starting with the first starting address, while outputting sequential pages in response to the first starting address, accepting a second command specifying a second starting address out of sequence relative to the sequential pages of the first command, and after accepting the second command and a page from the first sequence completes, outputting sequential pages in response, starting with the second starting address.

A device having a controller and a method are described, including a continuous read operation including a command with page address input which can be inserted in the continuous read (similar with Cache Read) to eliminate the read latency between non-sequential pages.

A device having a controller, and a method, are described including a continuous read operation including a command with page address input which can be inserted in the continuous read, the command will have the next page address which will be downloaded to the page buffer.

A device having a controller, and a method, are described including a continuous read operation including a command with page address input which can be inserted in the continuous read, the command will have the next page address which will be downloaded to the page buffer, in which the command is issued on each page.

A device having a controller, and a method, are described including a continuous read operation including a command with page address input which can be inserted in the continuous read, the command will have the next page address which will be downloaded to the page buffer, in which the command is only issued when there is a non-sequential page case.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A memory device, comprising:
a memory array;
a cache memory coupled to the memory array;
an input/output interface; and
a controller responsive to commands received at the input/output interface, the commands including a continuous page read command and a cache read command, wherein response to a continuous page read command includes execution of a continuous page read operation moving a sequence of pages in the memory array to the cache memory, and response to a cache read command includes execution of the cache read operation including outputting data from the cache memory to the input/output interface;
the continuous page read operation including starting with a starting page address as a current page address, accessing the memory array using the current page address to move a current page to the cache memory, and repeating a sequence until a termination event, the sequence including before completing the outputting of data of the current page from the cache memory, determining a next page address and then accessing the memory array using the next page address as the current page address to move a next page to the cache memory;
wherein the determining of the next page address includes, for at least one next page address in the sequence, receiving the next page address from the input/output interface.

2. The memory device of claim 1, wherein the next page address received from the input/output interface is non-sequential relative to the current page address.

3. The memory device of claim 1, wherein the next page address is received with a cache read command for a cache read operation to output data of the current page from the cache memory.

4. The memory device of claim 1, wherein the next page address is received with a cache read command for a cache read operation to output data of the current page from the cache memory for each next page address in the sequence.

5. The memory device of claim 1, wherein the determining of the next page address includes incrementing the address of the current page in case the next page address is not received from the input/output interface before outputting data of the current page from the cache memory.

6. The memory device of claim 1, wherein the accessing of the memory array using the starting page address as the current page to move the current page to the cache memory is characterized by an array read latency between receipt of the continuous page read operation and completion of the move to the cache memory, and said accessing of the memory array using the next page address received from the input/output interface begins before expiration of the array read latency.

7. The memory device of claim 1, wherein the input/output interface is a serial interface.

8. The memory device of claim 1, wherein the input/output interface is a serial interface, having at least one pin used for both receiving the next page address and outputting data from the cache memory.

9. The memory device of claim 1, wherein after the starting page, the current page follows a preceding page, and including receiving the next page address before outputting data of the preceding page from the cache memory.

10. A method of operating a memory device, a memory array; a cache memory coupled to the memory array; and an input/output interface; comprising:
responding to a continuous page read command by execution of a continuous page read operation moving a sequence of pages in the memory array to the cache memory, and responding to a cache read command by execution of a cache read operation including outputting data from the cache memory to the input/output interface;
the continuous page read operation including starting with a starting page address as a current page address, accessing the memory array using the current page address to move a current page to the cache memory, and repeating a sequence until a termination event, the sequence including before execution of a cache read operation to output data of the current page from the cache memory, determining a next page address and then accessing the memory array using the next page address as the current page address to move a next page to the cache memory;
wherein the determining of the next page address, for at least one next page address in the sequence, includes receiving the next page address from the input/output interface.

11. The method of operating a memory device of claim 10, wherein the next page address received from the input/output interface is non-sequential relative to the current page address.

12. The method of operating a memory device of claim 10, wherein the next page address is received with a cache read command for a cache read operation to output data of the current page from the cache memory.

13. The method of operating a memory device of claim 10, wherein the next page address is received with a cache read command for a cache read operation to output data of the current page from the cache memory for each next page address in the sequence.

14. The method of operating a memory device of claim 10, wherein determining the next page address includes incrementing the address of the current page in case the next page address is not received from the input/output interface before outputting data of the current page from the cache memory.

15. The method of operating a memory device of claim 10, wherein the accessing of the memory array using the starting page address as the current page to move the current page to the cache memory is characterized by an array read latency between receipt of the continuous page read operation and completion of the move to the cache memory, and said accessing of the memory array using the next page address received from the input/output interface begins before expiration of the array read latency.

16. The method of operating a memory device of claim 10, wherein the input/output interface is a serial interface.

17. The method of operating a memory device of claim 10, wherein the input/output interface is a serial interface, having at least one pin used for both receiving the next page address and outputting data from the cache memory.

18. The method of operating a memory device of claim 10, wherein after the starting page, the current page follows a preceding page, and including receiving the next page address before outputting data of the preceding page from the cache memory.

* * * * *